United States Patent [19]

Bockelman et al.

[11] Patent Number: 5,561,378
[45] Date of Patent: Oct. 1, 1996

[54] CIRCUIT PROBE FOR MEASURING A DIFFERENTIAL CIRCUIT

[75] Inventors: David E. Bockelman, Plantation; William R. Eisenstadt, Gainesville, both of Fla.

[73] Assignee: Motorola, Inc., Schaumburg, Ill.

[21] Appl. No.: 270,359

[22] Filed: Jul. 5, 1994

[51] Int. Cl.⁶ .................................. G01R 1/06; H01P 3/08
[52] U.S. Cl. .............................................. 324/754; 333/246
[58] Field of Search .............................. 324/158.1, 765, 324/754, 613, 603, 72.5; 437/8; 439/482, 824; 333/246, 203, 10, 116, 248

[56] References Cited

U.S. PATENT DOCUMENTS

| | | | |
|---|---|---|---|
| 3,562,674 | 2/1971 | Gerst | 333/116 |
| 3,575,674 | 4/1971 | Howe, Jr. | 333/116 |
| 3,659,228 | 4/1972 | Napoli | 333/10 |
| 4,591,812 | 5/1986 | Stegens et al. | 333/246 |
| 4,697,143 | 9/1987 | Lockwood et al. | 324/754 |
| 4,697,161 | 9/1987 | Buoli | 333/116 |
| 4,764,723 | 8/1988 | Strid | 324/765 |
| 4,827,211 | 5/1989 | Strid et al. | 324/754 |
| 4,871,964 | 10/1989 | Boll et al. | 324/754 |
| 4,996,488 | 2/1991 | Nave | 324/613 |
| 5,317,291 | 5/1994 | Podell | 333/203 |

OTHER PUBLICATIONS

Microwave Wafer Probing, by Dale E. Carlton, K. Reed Gleason and Eric Strid, Microwave Journal, Jan. 1984, pp. 121–129.

Shielded Coupled–Strip Transmission Line, by S. E. Cohn, IRE Transactions—Microwave Theory and Techniques, Oct., 1955, pp. 29–38.

Primary Examiner—Vinh P. Nguyen
Attorney, Agent, or Firm—Andrew S. Fuller

[57] ABSTRACT

A circuit probe (300) is provided for measuring a differential circuit. The circuit probe (300) incorporates a novel transmission line (325) which is formed to propagate signals with substantially equal even-mode and odd-mode characteristic impedances. The circuit probe (300) further includes signal contacts (314, 316) and ground contacts (312, 318) coupled to signal conductors (334, 336) and ground conductors (332, 338), respectively, of the transmission line (325).

13 Claims, 5 Drawing Sheets

CIRCUIT PROBE FOR MEASURING A DIFFERENTIAL CIRCUIT

CROSS REFERENCE TO RELATED APPLICATIONS

This application is related to U.S. Ser. No. 08/270,356, Docket No. CM01685J, concurrently filed on Jun. 29, 1994, entitled "METHOD AND APPARATUS FOR CHARACTERIZING A DIFFERENTIAL CIRCUIT", by David E. Bockelman and William R. Eisenstadt and assigned to Motorola, Inc. now U.S. Pat. No. 5,495,173.

TECHNICAL FIELD

This invention relates generally to differential circuits, and more particularly, to the characterization of differential circuits through measurements.

BACKGROUND OF THE INVENTION

There has been an emerging need to isolate separate circuits constructed on the same integrated circuit. For example, it may be necessary to isolate a circuit with high sensitivity, such as an analog circuit, from an circuit having high transient noise, such as a digital circuit. Traditional single-ended circuits have been replaced with differential circuits in some low-frequency applications where such concerns have arisen. Differential circuits can provide better isolation in some applications as certain types of interferences may be greatly reduced. However, differential circuits are more difficult to design and test than typical single-ended circuits, particularly when such differential circuits are designed to process signals carried on radio and microwave frequencies. Traditional methods of testing differential circuits have been based on measuring voltages and currents. For example, in a typical test environment for integrated circuits, test probes engage ports on circuit wafers to determine voltages and currents between two points on a differential circuit. The use of voltages and currents fail at radio frequencies and at microwave frequencies because of difficulties in providing accurate measurements.

Scattering parameters have been developed for single-ended N-port circuits. No corresponding characterization parameters have been developed to fully characterize radio frequency and microwave frequency based differential circuits. Currently, it is possible to perform partial measurements of differential modes using a balanced probe, manufactured by CASCADE MICROTECH. However, this technique does not allow for full characterization of the differential circuit. The prior art lacks both an adequate methodology and apparatus to properly characterize radio and microwave frequency differential circuits. Therefore, a new measurement technique for characterizing radio and microwave frequency differential circuits is required.

DETAILED DESCRIPTION OF THE PREFERRED EMBODIMENT

Generally, the present provides a method and apparatus for characterizing differential circuits. Scattering parameters (S-parameters) have been developed for differential circuits, and a measurement system defined for determining the S-parameters. In the preferred embodiment, a switching network provides differential and common mode signals for input to a differential circuit under test. The input signals are propagated over a coupled transmission line pair with substantially equal even and odd mode characteristic impedances and through a circuit probe to the differential circuit. Measurements are conducted at one or more ports of the differential circuit to determine signal propagation characteristics. Scattering parameters are then determined from the input signals, and the measured output signals to characterize the differential circuit.

DIFFERENTIAL CIRCUITS

Figure 1:
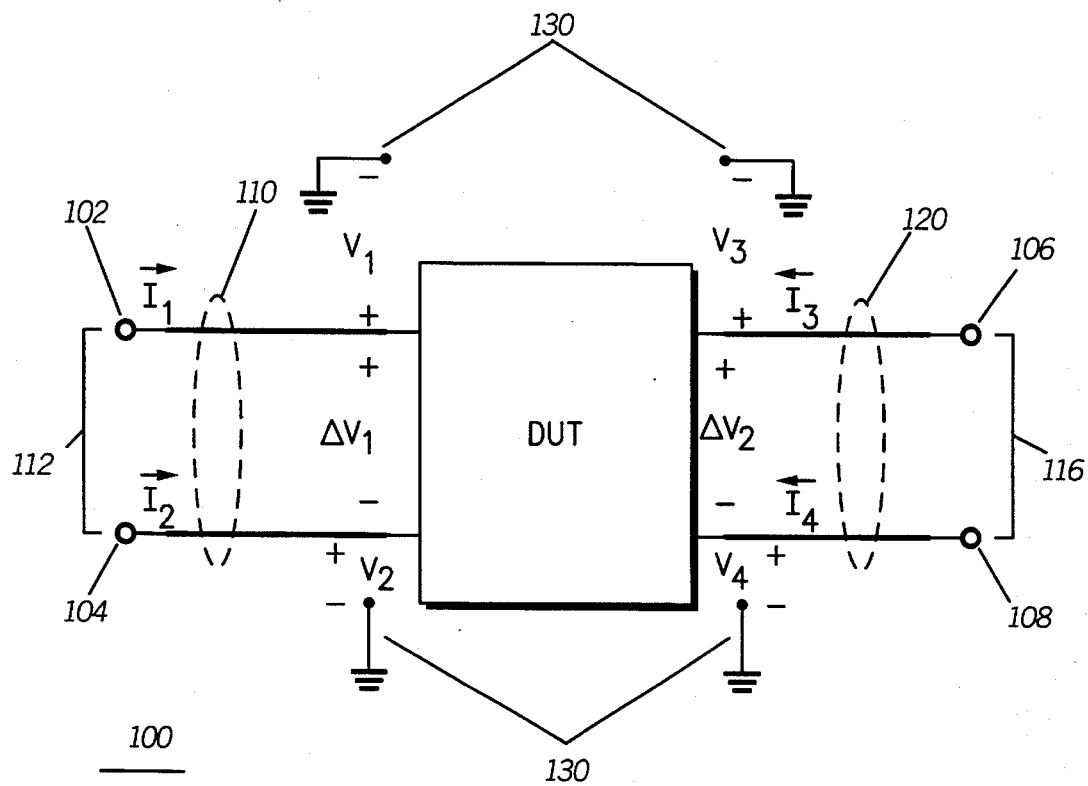
FIG. 1 is a block diagram of a two-port differential circuit.

Referring to FIG. 1, a simplified differential circuit 100 is shown, as may be developed for a radio frequency (RF) or microwave frequency application, in accordance with the present invention. Pairs of coupled transmission lines 110, 120 provide input and output to the differential circuit 100. As is typical in a differential circuit, differential mode signals are described by a difference in voltage and current flow between the individual lines in a coupled pair, where the difference in voltage ($\Delta V_1$, $\Delta V_2$) is not equal to zero. Using these definitions, a signal propagating between the lines of the coupled pairs 110, 120 is not referenced to a ground potential, but rather to each other, and thus the term differential mode signal. This differential mode signal propagates in a transverse electro-magnetic (TEM), or quasi-TEM fashion with a well-defined characteristic impedance and propagation constant. The coupled line pairs 110, 120 allow propagating differentials signals to exist. In the preferred embodiment, the differential circuit 100 has two ports 112, 116, however, the concepts of the present invention is applicable to N-port circuits.

As in most practical implementations of differential circuits, a ground plane 130, or some other global reference conductor, is incorporated either intentionally or unintentionally. This ground plane 130 allows another mode of propagation to exist, namely common mode propagation. Generally, the common mode wave applies equal signals with respect to ground at each of the individual lines in a coupled pair, such that the differential voltage is 0, i.e., $\Delta V_1 = \Delta V_2 = 0$. According to the present invention, both common mode and differential mode signals are treated as propagating simultaneously, and these modes are used to properly characterize the differential circuit. Thus, in general, a signal traveling along a coupled transmission line pair within a differential circuit is a combination of differential mode waves and common mode waves. This combination is referred to as mixed-mode propagation. From this mixed-mode propagation, scattering parameters (S-parameters) are defined which adequately characterizes the differential circuit.

MIXED MODE "S" PARAMETERS

Before defining the S-parameters, additional definitions are needed to establish a reference base. The differential mode voltage ($V_{dm}$) at a point, x, is defined to be the difference between voltages on node(1) 102 and node(2) 104:

$$V_{dm}(x) = V_1 - V_2.$$

This standard definition establishes a signal that is no longer referenced to ground. In a differential circuit, one would expect equal current magnitudes to enter the positive input terminal as that leaving the negative input terminal. Therefore, the differential mode current ($I_{dm}$) is defined as one-half the difference between currents entering node(1) 102 and node(2) 104.

$$I_{dm}(x) = \tfrac{1}{2}(I_1 - I_2).$$

The common mode voltage in a differential circuit is typically the average voltage of the port. Hence, common mode voltage ($V_{cm}$) is ½ the sum of the voltages on node(1) 102 and node(2) 104:

$$V_{cm}(x) = \tfrac{1}{2}(V_1 + V_2).$$

The common mode current ($I_{cm}$) at a port is the total current flowing into the port, i.e., $$I_{cm}(x) = I_1 + I_2.$$

The characteristic impedance of each mode ($Z_{dm}, Z_{cm}$) can be defined as a ratio of the voltage to current of the appropriate modes at any point, x, along the line:

$$Z_{dm} = V_{dm}(x)/I_{dm}(x);$$

$$Z_{cm} = V_{cm}(x)/I_{cm}(x).$$

As is generally known in the art, a symmetrical coupled pair of transmission lines can support two fundamental modes—an even mode and an odd mode. Additionally, there are even and odd mode characteristic impedances associated with the even and odd modes of signals propagating on a symmetrical coupled transmission line pair with respect to ground. The mode characteristic impedance for the even mode is termed $Z_e$, and for the odd mode, $Z_o$. The characteristic impedances of the differential mode and common mode can be related to that of the odd mode and even mode, respectively, by the following equations:

$$Z_{dm} = 2Z_o;$$

$$Z_{cm} = Z_e/2.$$

As earlier stated, the preferred embodiment provides for analysis of a two-port differential circuit, and as such, normalized wave equations have been developed. Imposing the condition of low-loss transmission lines on the coupled pair, the characteristic impedances are approximately purely real. Under this condition, $Z_{dm} \approx R_{dm}$, and $Z_{cm} \approx R_{cm}$, where $R_{dm}$ and $R_{dm}$ are the real portions of $Z_{dm}$ and $Z_{cm}$, respectively. Accordingly, the normalized wave equations at the first port 112 can be stated as:

$$a_{dm_1} = \frac{1}{2\sqrt{R_{dm}}} [V_{dm}(x) + I_{dm}(x)R_{dm}]|_{x=0}$$

$$b_{dm_1} = \frac{1}{2\sqrt{R_{dm}}} [V_{dm}(x) - I_{dm}(x)R_{dm}]|_{x=0}$$

$$a_{cm_1} = \frac{1}{2\sqrt{R_{cm}}} [V_{cm}(x) + I_{cm}(x)R_{cm}]|_{x=0}$$

$$b_{cm_1} = \frac{1}{2\sqrt{R_{cm}}} [V_{cm}(x) - I_{cm}(x)R_{cm}]|_{x=0}$$

An analogous analysis will yield the normalized equations for the second port 116 using the corresponding voltages ($V_3, V_4$) and currents ($I_3, I_4$) at node(3) 106 and node(4) 108. Similarly, parameters can be developed for an N-port differential circuit.

Generally, the mixed-mode S-parameters may be defined as:

$$[b] = [S][a]$$

where [a] and [b] denote n-dimensional column vectors, and [S] denotes an n-by-n matrix. For a two-port application, the generalized mixed-mode two-port S-parameters can be stated as:

$$\begin{bmatrix} b_{dm_1} \\ b_{dm_2} \\ b_{dm_1} \\ b_{cm_2} \end{bmatrix} = \begin{bmatrix} S_{dd} | S_{dc} \\ \overline{S_{cd} | S_{cc}} \end{bmatrix} \begin{bmatrix} a_{dm_1} \\ a_{dm_2} \\ a_{dm_1} \\ a_{cm_2} \end{bmatrix}$$

where [$S_{dd}$] is a 2-by-2 matrix representing the differential S-parameters, [$S_{cc}$] is a 2-by-2 matrix representing the common mode S-parameters, [$S_{dc}$] and [$S_{cd}$], are the mode conversion or cross mode S-parameters. In particular, [$S_{dc}$] describes the conversion of common mode waves into differential common mode waves, and [$S_{cd}$] describes the conversion of differential mode waves into common waves.

Having presented some of the theoretical aspects of the present invention, the S-parameter measurement system of the preferred embodiment will now be described.

Figure 2:
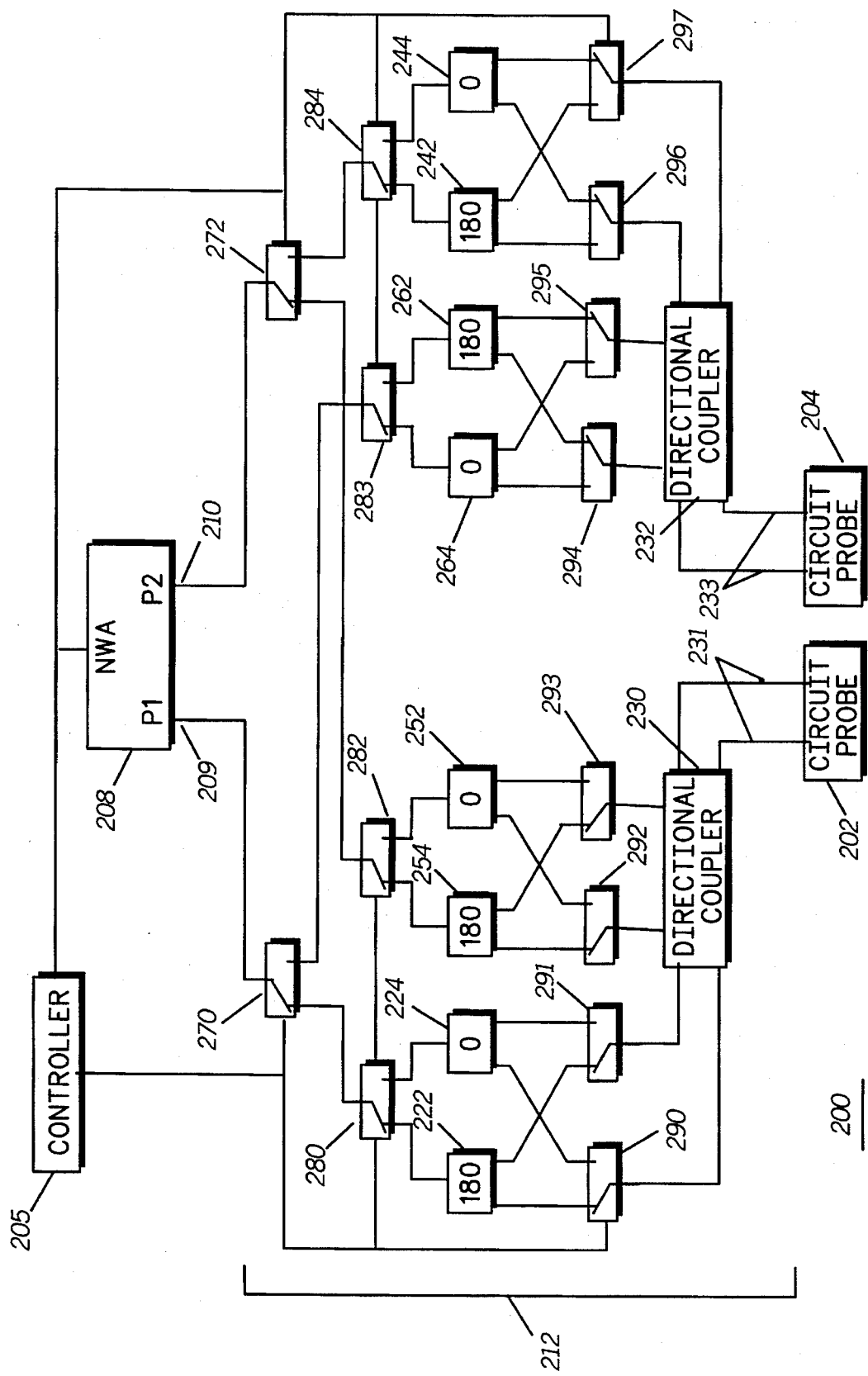
FIG. 2 is a block diagram of a measurement system, in accordance with the present invention.

Referring to FIG. 2, a block diagram of a measurement system 200 is shown, in accordance with the present invention. The measurement system 200 includes a two-port network analyzer (NWA) 208, a switching network 212, and a pair of circuit probes 202, 204. The measurement system 200 operates under the control of a controller 205. The switching network 212 is coupled to ports 209, 210 on the NWA 208 via a two-position switches 270, 272. The switch 270 is coupled to a pair of switches 280, 283. Switch 280 is coupled to a 180° signal splitter/combiner 222 and a 0° splitter/combiner 224. In the 180° splitter/combiner 222, the splitter function splits a signal into two signal components having substantially equal amplitudes, and having a phase difference of substantially 180 degrees. Conversely, the 180° combiner function substantially substracts two periodic signals resulting in a single signal. In the 0° splitter/combiner 224, the splitter function splits a signal into two signal components having substantially equal amplitudes and having substantially equal phase. The 0° combiner function substantially adds two periodic signals resulting in a single signal. Two switches 290, 291 couple the 180° signal splitter/combiner 222 and the 0° splitter/combiner 224 to a circuit probe 202 via coupled transmission lines 231. Switth 283 is coupled to a 180° signal splitter/combiner 262 and a 0° splitter/combiner 264 having similar functionality to the 180° signal splitter/combiner 222 and the 0° splitter/combiner 224 described above. Two switches 295, 294 couple the 180° signal splitter/combiner 262 and the 0° splitter/combiner 264 to a circuit probe 204 via directional couplers 232. The directional couplers 232 permit the tapping of signals originating at circuit probe 204.

Similarly, switch 272 is coupled to a pair of switches 282, 284. Switch 284 is coupled to a 180° signal splitter/combiner 242 and a 0° splitter/combiner 244 having similar functionality to the 180° signal splitter/combiner 222 and the 0° splitter/combiner 224 described above. Two switches 296, 297 couple the 180° signal splitter/combiner 242 and the 0° splitter/combiner 244 to a circuit probe 204 via coupled transmission lines 233. Switch 282 is coupled to a 180° signal splitter/combiner 252 and a 0° splitter/combiner 254 having similar functionality to the 180° signal splitter/combiner 222 and the 0° splitter/combiner 224 described above. Two switches 293, 292 couple the 180° signal splitter/combiner 252 and the 0° splitter/combiner 254 to a circuit probe 202 via directional couplers 230. The directional couplers 230 permit the tapping of signals originating at circuit probe 202.

The measurement system 200 can be used to produce and measure signals which are used to calculate S-parameters in order to characterize a differential circuit when interfaced via the circuit probes 202, 204 to the differential circuit. As such, the measurement system 200 can generate differential and common mode signals having known attributes for input into a differential circuit of a device under test (DUT). Similarly, the measurement system 200 can measure corresponding differential and common mode signals present at one or more ports of the DUT. Consequently, the S-parameters may be calculated as will be described below. For example, to produce a differential mode signal for input via circuit probe 202, switch 280 is positioned to couple the 180° splitter/combiner 222 to the NWA, and switches 290 and 291 positioned to couple the 180° splitter/combiner to the circuit probe 202. The NWA generates a signal, such as a radio frequency (RF) signal, which is split by the 180° splitter/combiner 222 to produce a differential mode signal having signal components having substantially equal amplitudes and having a phase difference of substantially 180°. The differential mode signal is transmitted through the transmission line and launched into a port of a DUT via the circuit probe 202. By selecting the 180° splitter/combiner 242 or the 0° splitter/combiner 244, differential signals and common mode signals, respectively, may be measured at port 210. A reflected signal having a mode (differential or common) corresponding to the input signal is measured through the NWA port 209, 210 from which the input signal is sent. For example, to generate a differential mode signal for input from port 209 through circuit probe 202, switches 270, 280, 290, and 291, are set such that a path through the 180° splitter/combiner 222 is chosen. This setting also allows measurement of the reflected differential mode signal returning through probe 202. However, to measure the reflected common mode signal using the same input, the measurement is taken at NWA port 210 by setting switches 272, 282, 292, and 293, such that a path through the 0° splitter/combiner 254 is enabled. One skilled in the art would appreciate that by varying the combination of switches and signal sources (NWA ports 209, 210), both transmitted and reflected differential and common mode signals may be measured. Using these measurements, all mixed mode S-parameters can be calculated as defined above.

THE CIRCUIT PROBE

According to the present invention, a circuit probe is provided for interfacing the measurement system to the differential circuit of a DUT. The probe incorporates a coupled pair of transmission lines to convey signals having at least two modes of propagation between the measurement system and the differential circuit. Traditionally, transmission lines have been formed such that the even-mode characteristic impedance is much larger than the odd-mode characteristic impedance, i.e., $Z_e >> Z_o$. With this relationship, the odd-mode propagation is favored over even-mode propagation, due to the mismatch loss of even-mode waves; therefore the differential mode signal is favored. The transmission line pair of the present invention is designed such that the even and odd modes propagate with substantially equal characteristic impedances, i.e., $Z_e = Z_o$. The use of a transmission line having $Z_e = Z_o$ in the probe is counter-intuitive to prior art design guidelines. However, by using a transmission line with these characteristics, the implementation and use of the measurement system is facilitated.

Figure 3:
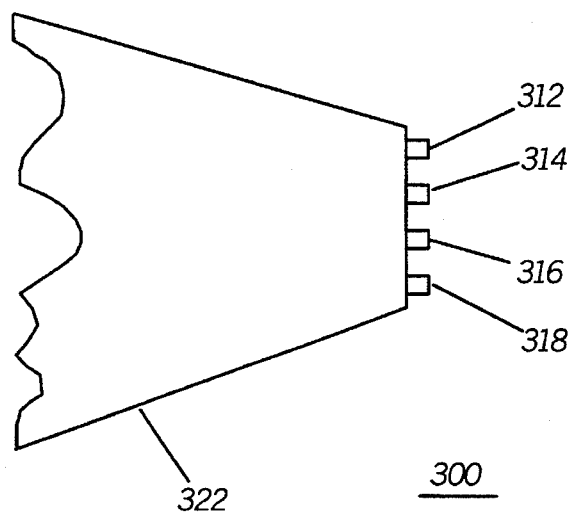
FIG. 3 is a fragmentary top view of a circuit probe showing the tip portion, in accordance with the present invention.

In the preferred embodiment, the circuit probe is designed for interfacing with a two-port differential circuit implemented on a wafer or other integrated circuit medium. Referring to FIG. 3, a fragmentary top view of a circuit probe 300 is shown, in accordance with the present invention. The circuit probe 300 is adaptable to function as the circuit probes 202, 204, used in the measurement system 200 described above. In the preferred embodiment, the probe has four contacts 312, 314, 316, 318. These contacts comprise two ground contacts 312, 318 at opposing ends of the probe, and two coupled signal contacts 314, 316 positioned between the two ground contacts. The two signals contacts forms coupled signal paths. The coupled signals paths are balanced, such as being symmetrical, and the probe allows both even and odd modes to propagate in an approximately loss-less fashion. Furthermore, the even and odd modes propagate with welt-defined characteristic impedances.

Figure 6:
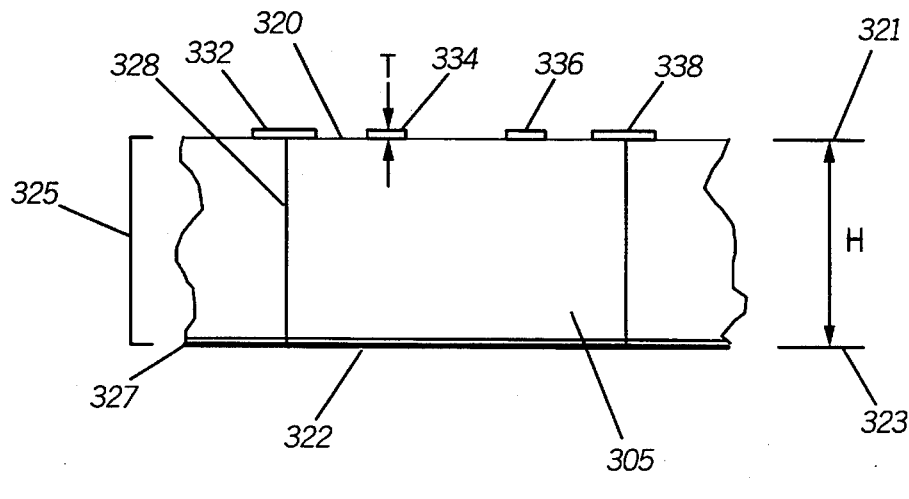
FIG. 6 is a fragmentary cross-sectional view of the circuit probe of FIG. 3.
Figure 4:
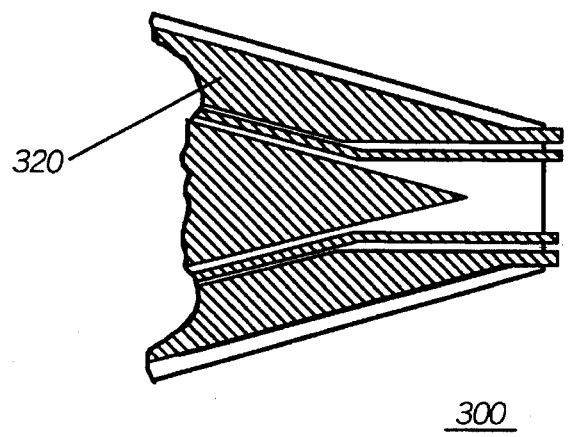
FIG. 4 is a second fragmentary view of the circuit probe of FIG. 3 showing the bottom or interface surface.
Figure 5:
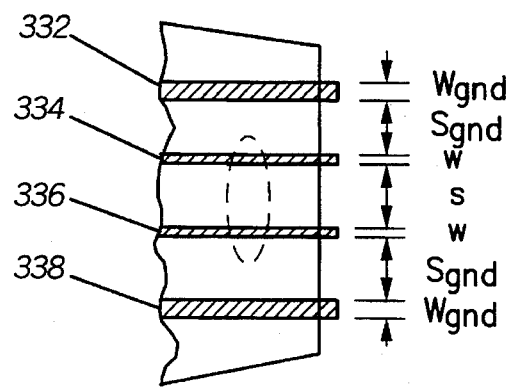
FIG. 5 is an enlarged fragmentary view showing dimensional characteristics of a transmission line of the circuit probe of FIG. 3.

FIG. 4 is a second fragmentary view of the circuit probe 300 showing the bottom or interface surface. FIG. 5 is a fragmentary cross-sectional view of the circuit probe 300. FIG. 6 is an enlarged fragmentary view showing dimensional characteristics of a transmission line of the circuit probe 300. Referring to FIGS. 3–6, at least a portion of the circuit probe 300 of the preferred embodiment is implemented on an alumina substrate 305 having a relative dielectric constant between 9.6 and 9.9. The alumina substrate is planar and has first and second opposing surfaces 320, 322. A coupled mode transmission line 325 is implemented on the alumina substrate such that signals propagating on the transmission line 325 will have equal or substantially equal even and odd-mode impedances. The transmission line is formed by disposing adjacent signal conductors 334, 336 in a coupled microstrip arrangement on a first plane 321 at or near the first surface 320 of the alumina substrate 305. The signal conductors 334, 336 of the coupled microstrip are symmetrical, and each signal conductor has a thickness, T, and a width, W. Each signal conductor 334, 336 is spaced apart from each other by a spacing, S. The signal conductors 334, 336 are disposed between two coplanar ground conductors 332, 338, the two coplanar ground conductors 332, 338 forming a coplanar ground plane. Each ground conductor 332, 338 has substantially the same thickness as the signal conductor, T. Additionally, each ground conductor 332, 338 has a width, $W_{gnd}$ and is spaced apart from the closest signal conductor by a spacing, $S_{gnd}$. A second ground plane 327 is disposed on a second plane 323, at or near the second surface 322 of the alumina substrate 305, and parallel to the coupled microstrip 334, 336 and to the coplanar ground conductors 332, 338. The second ground plane 327 is electrically coupled to the coplanar ground conductors 332, 338, by conductive vias 328. The first and second parallel planes 321, 323 are spaced apart by a spacing, H, and are separated by alumina substrate material 305. According to the present invention, design parameters have been developed for the transmission line 325, including the coupled microstrip 334, 336, the coplanar ground conductors 332, 338, and the bottom ground plane 327, relating to the spatial and dimensional characteristics of each.

The design parameters are defined with respect to a 50 ohm impedance system. The thickness, T, should be substantially less than H, i.e., $$T \leq \frac{H}{10}.$$

The ratio of $W_{gnd}$ to $S_{gnd}$ should be such that:

$$\frac{W_{gnd}}{S_{gnd}} \geq 0.1.$$

The following design parameters are based in part on the relative dielectric constant, $\epsilon_r$ of the substrate 305 used in constructing the transmission line 325. For a given relative dielectric constant, $\epsilon_r$, W/H should be in the range defined below to ensure the return loss (into $Z_e = Z_o = 50\Omega$) of the differential and common modes are both at least 25 dB. Thus, $$(W/H)_{MIN} \leq \frac{W}{H} \leq (W/H)_{MAX},$$

where, $$(W/H)_{MAX} = 1/(0.520\epsilon_r^{0.47} + 0.011\epsilon_r^{1.65})$$

$$(W/H)_{MIN} = 1/(0.300\epsilon_r^{0.40} + 0.012\epsilon_r^{1.80})$$

Figure 7:
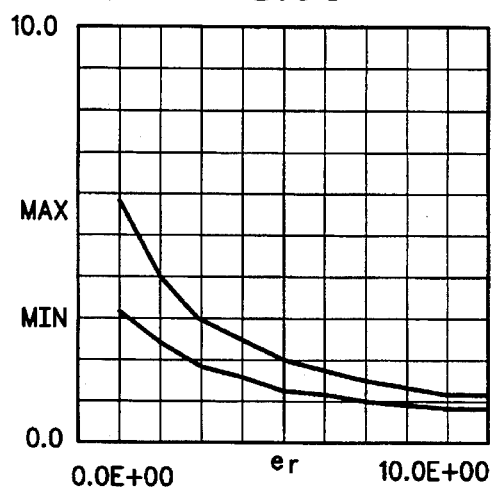
FIG. 7 is a graph of a design parameter for a transmission line based on the ratio of the width of a transmission line signal conductor to the separation between the conductor and an underlying ground plane, and the relative dielectric constant of the substrate separating the conductor and ground plane.

A graph reflecting $(W/H)_{max}$ and $(W/H)_{min}$ versus the substrate relative dielectric constant $\epsilon_r$ is shown in FIG. 7. For a given relative dielectric constant, $\epsilon_r$, the ratio of W/S should be less than or equal to the maximum value (defined below) to ensure the return loss (into 50Ω) of the differential and common modes are both at least 25 dB. Thus, $$\frac{W}{S} \leq (W/S)_{MAX},$$

Where, $$(W/S)_{MAX} = 11.0 / (\epsilon_r^{1.30}).$$

Figure 8:
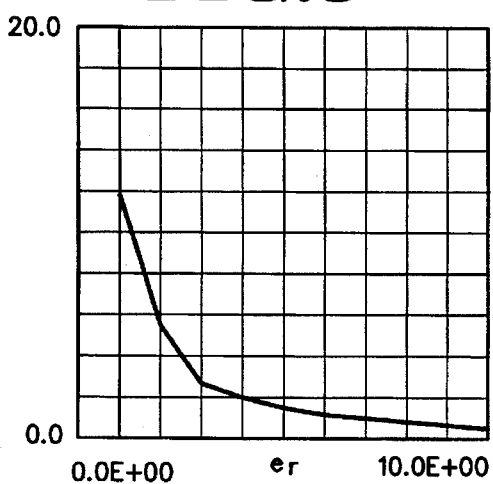
FIG. 8 is a graph of a design parameter for a transmission line based on the ratio of the width of a transmission line signal conductor to the spacing between coupled signal conductors, and the dielectric constant of the substrate separating the conductor and ground plane.

A graph reflecting (W/S)max versus the substrate relative dielectric constant $\epsilon_r$ is shown in FIG. 8. For a given relative dielectric constant, $\epsilon_r$, the ratio of $W/S_{gnd}$ should be less than or equal to a maximum value to ensure the return loss (into 50Ω) of the differential and common modes are both at least 25 dB. Thus, $$\frac{W}{S_{gnd}} \leq (W/S_{gnd})_{MAX}$$

where, $$(W/S_{gnd})_{MAX} = 80/(\epsilon_r^{1.5}).$$

Figure 9:
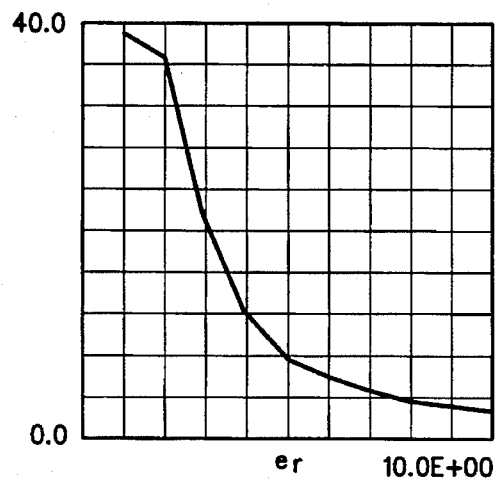
FIG. 9 is a graph of a design parameter for a transmission line based on the ratio of the width of a transmission line signal conductor to the spacing between the conductor and a coplanar ground plane, and the relative dielectric constant of the substrate separating the conductor and ground plane.

A graph reflecting $(W/S_{gnd})_{max}$ versus the substrate relative dielectric constant $\epsilon_r$ is shown in FIG. 9.

The design parameters described above can be used in conjunction to provide for an even mode and odd mode propagation having low insertion loss (less than 0.1 dB), and a high return loss (greater than 30 dB) into a 50 ohm load. The above parameters are scalable, thus enabling various embodiments of the physical probe. In the preferred embodiment, the substrate 305 has $\epsilon_r$ of approximately 9.6, and the design parameters are such that, T<H/10; W/S≈0.2; W/H≈1.0; W/S$_{gnd}$≈1.0; and $W_{gnd}/S_{gnd}$>=1.

METHOD OF OPERATION

Ordinarily, in a two-port system, the signals are launched at one port and measured at both ports. The measurements encompass the differential and common signals detected at each port, including the input port, when a differential mode signal or a common mode signal is launched at the input port. The combiners are selectively switched in at each port such that the signals present on the coupled pair of transmission lines are combined and presented at NWA ports for analysis.

Figure 10:
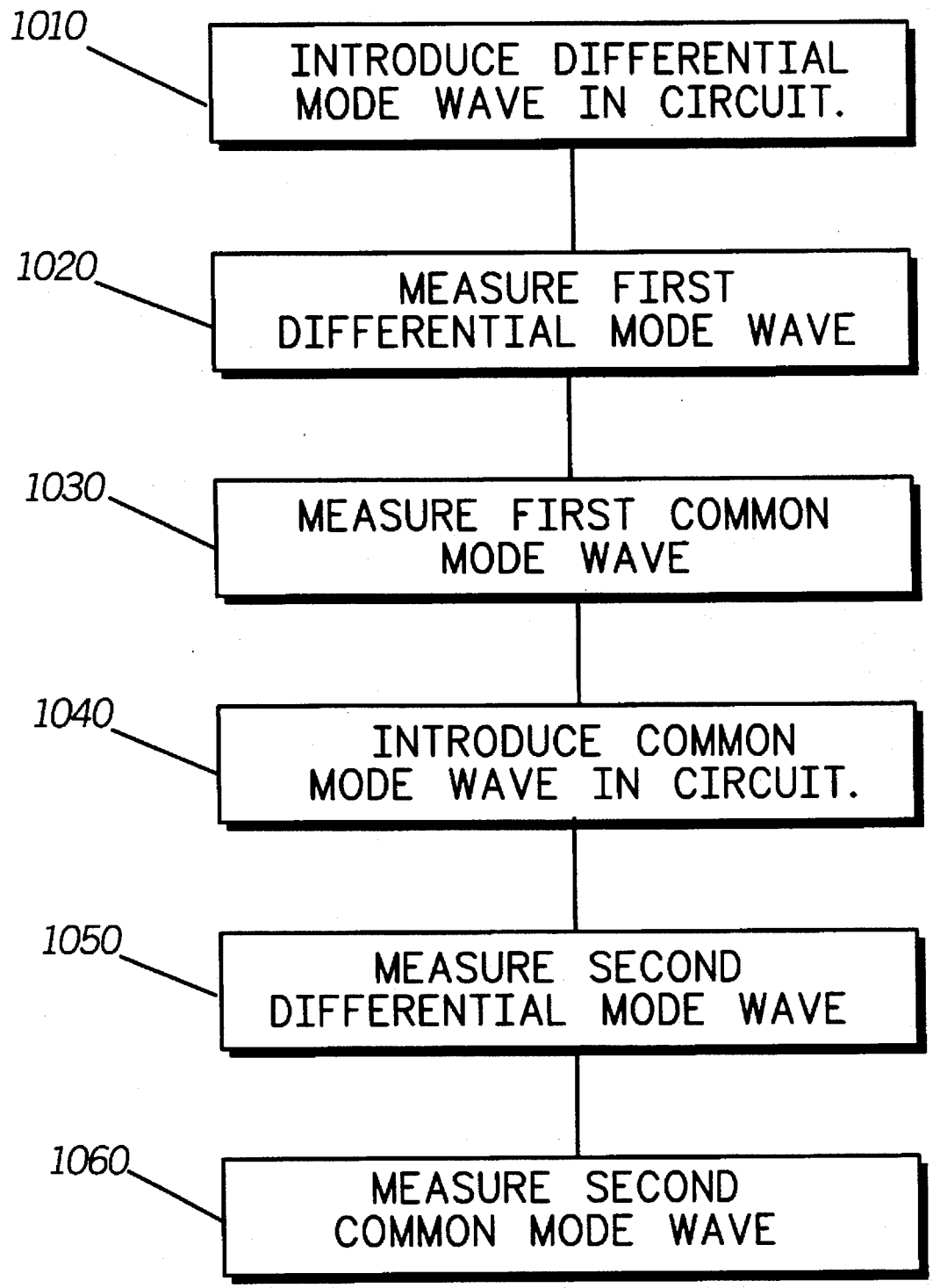
FIG. 10 is a representation of procedures used in characterizing a differential circuit, in accordance with the present invention.

The measurement system can be operated to determine S-parameters, as described above, for the characterization of a differential circuit for a DUT. Referring to FIG. 10, the procedures for determining the S-parameters are summarized. An input differential wave is introduced or injected into a port of the differential circuit, step 1010. The input differential wave is provided via a signal generated by the NWA, which is routed through the 180° splitter/combiner, and propagated over a coupled pair of transmission lines to a port on the differential circuit. While introducing the input differential wave, a first differential output wave is measured, step 1020. Also while introducing the input differential wave, a first common mode output wave is measured, step 1030. Likewise, an input common mode wave is introduced into the differential circuit, step 1040. The input common mode wave is provided via a signal generated by the NWA, which is routed through the 0° splitter/combiner, and propagated over a coupled pair of transmission lines to a port on the differential circuit. While introducing the input common mode wave, a second differential output wave is measured, step 1040. Also while introducing the input common mode wave, a second common mode output wave is measured, step 1050. This process is repeated at each port in an N-port device. Preferably, output waves are measured at all ports, including the input port. In a two-port device, there will be sixteen (16) combinations of input and output signals for calculating the S-parameters to fully characterize the differential circuit.

CONCLUSIONS

According to the present invention, full characterization of a device under test (DUT) can be accomplished automatically with only two probes. Full characterization includes differential S-parameters, common mode S-parameters, and cross-mode (or mode-conversion) S-parameters. Full knowledge of all parameters, especially the cross-mode, is a significant aspect of the present invention as it relates to error correction and calibration. Consequently, the accuracy of the measurement system is enhanced.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A circuit probe particularly applicable for measuring a differential circuit, the circuit probe comprising:
   a transmission line comprising:
      first and second ground conductors; and first and second coupled signal conductors adjacently disposed between the first and second ground conductors; the signal conductors and ground conductors being formed to propagate signals with substantially equal even-mode and odd-mode characteristic impedances;
   first and second ground contacts coupled to the first and second ground conductors, respectively; and
   first and second signal contacts coupled to the first and second signal conductors, respectively.

2. A circuit probe particularly applicable for measuring a differential circuit, the circuit probe comprising:
   a transmission line comprising:
      first and second around conductors; and
      first and second coupled signal conductors, wherein the first and second coupled signal conductors are disposed between, and on a first plane substantially coplanar with, the first and second ground conductors;
      the signal conductors and ground conductors being formed to propagate signals with substantially equal even-mode and odd-mode characteristic impedances;
   first and second ground contacts coupled to the first and second ground conductors, respectively;
   first and second signal contacts coupled to the first and second signal conductors, respectively;
   a ground plane disposed substantially parallel to the first plane, the ground plane being electrically coupled to the ground conductors; and
   a substrate disposed between the signal conductors and ground conductors, and the ground plane.

3. The circuit probe of claim 2, wherein:
   the substrate has a relative dielectric constant $\epsilon_r$;
   each ground conductor has a width, $W_{gnd}$;
   each signal conductor has a width W, and is separated from each other by a spacing, S, and is separated from one of the ground conductors by a spacing $S_{gnd}$;
   the ground conductors and signal conductors are separated from the ground plane by as spacing, H; wherein:

$$(W/H)_{MIN} \leq \frac{W}{H} \leq (W/H)_{MAX},$$

where, $$(W/H)_{MAX} = 1/(0.520\epsilon_r^{0.47} + 0.011\epsilon_r^{1.65})$$

$$(W/H)_{MIN} = 1/(0.300\epsilon_r^{0.40} + 0.012\epsilon_r^{1.80}).$$

4. The circuit probe of claim 3, wherein:

$$\frac{W}{S} \leq (W/S)_{MAX},$$

where, $$(W/S)_{MAX} = 11.0/(0.740\epsilon_r + 0.20\epsilon_r^2 - 0.011\epsilon_r^3).$$

5. The circuit probe of claim 4, wherein:

$$\frac{W}{S_{gnd}} \leq (W/S_{gnd})_{MAX},$$

where, $$(W/S_{gnd})_{MAX} = 80/(\epsilon_r^{1.5}).$$

6. The circuit probe of claim 5, wherein:

$$\frac{W_{gnd}}{S_{gnd}} \geq 0.1.$$

7. The circuit probe of claim 2, wherein:
   the substrate comprises alumina;
   each ground conductor has a width, $W_{gnd}$;
   each signal conductor has a width W, and is separated from each other by a spacing, S, and is separated from one of the ground conductors by a spacing $S_{gnd}$;
   the ground conductors and signal conductors are separated from the ground plane by as spacing, H; and
   wherein:
      W/S is substantially equal to 0.2;
      W/H is substantially equal to 1.0;
      $W/S_{gnd}$ is substantially equal to 1.0; and
      $W_{gnd}/S_{gnd} \geq 1$.

8. A transmission line comprising:
   first and second coupled signal conductors;
   first and second coplaner ground conductors, the first and second coupled signal conductors being adjacently disposed between, and being substantially coplanar with the first and second ground conductors;
   a ground plane disposed substantially parallel to the ground conductors and signal conductors, the ground plane being electrically coupled to the ground conductors; and
   a substrate disposed between the signal conductors and ground conductors, and the ground plane;
   wherein the signal conductors and ground conductores propagate signals with substantially equal even-mode and odd-mode characteristic impedances.

9. The transmission line of claim 8, wherein:
   the substrate has a relative dielectric constant $\epsilon_r$;
   each ground conductor has a width, $Wg_{nd}$;
   each signal conductor has a width W, and is separated from each other by a spacing, S, and is separated from one of the ground conductors by a spacing $S_{gnd}$;
   the ground conductors and signal conductors are separated from the ground plane by as spacing, H; wherein:

$$(W/H)_{MIN} \leq \frac{W}{H} \leq (W/H)_{MAX},$$

$$(W/H)_{MAX} = 1/(0.520\epsilon_r^{0.47} + 0.011\epsilon_r^{1.65})$$

$$(W/H)_{MIN} = 1/(0.300\epsilon_r^{0.40} + 0.012\epsilon_r^{1.80}).$$

10. The transmission line of claim 9, wherein:

$$\frac{W}{S} \leq (W/S)_{MAX},$$

where, $(W/S)_{MAX} = 11.0/(\epsilon_r^{1.30}).$

11. The transmission line of claim 10, wherein:

$$\frac{W}{S_{gnd}} \leq (W/S_{gnd})_{MAX},$$

where, $(W/S_{gnd})_{MAX} = 80/(\epsilon_r^{1.5}).$

12. The transmission line of claim 11, wherein:

$$\frac{W_{gnd}}{S_{gnd}} \geq 0.1.$$

13. The transmission line of claim 8, wherein:
the substrate comprises alumina;
each ground conductor has a width, $W_{gnd}$;
each signal conductor has a width W, and is separated from each other by a spacing, S, and is separated from one of the ground conductors by a spacing $S_{gnd}$;
the ground conductors and signal conductors are separated from the ground plane by as spacing, H; and
wherein:
W/S is substantially equal to 0.2;
W/H is substantially equal to 1.0;
$W/S_{gnd}$ is substantially equal to 1.0; and
$W_{gnd}/S_{gnd} >= 1$.

* * * * *